(12) United States Patent
Takahashi et al.

(10) Patent No.: US 9,887,724 B2
(45) Date of Patent: Feb. 6, 2018

(54) ELECTRONIC APPARATUS

(71) Applicant: KYOCERA Corporation, Kyoto-shi, Kyoto (JP)

(72) Inventors: Daisuke Takahashi, Neyagawa (JP); Hiroyoshi Kawanishi, Sanda (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/167,892

(22) Filed: May 27, 2016

(65) Prior Publication Data

US 2016/0277057 A1    Sep. 22, 2016

Related U.S. Application Data

(63) Continuation of application No. PCT/JP2015/084634, filed on Dec. 10, 2015.

(30) Foreign Application Priority Data

Dec. 25, 2014    (JP) ................. 2014-262326

(51) Int. Cl.
*H04M 1/00*        (2006.01)
*H04B 1/3888*     (2015.01)
(Continued)

(52) U.S. Cl.
CPC ........... *H04B 1/3888* (2013.01); *H01H 13/06* (2013.01); *H04M 1/18* (2013.01); *H05K 5/0217* (2013.01);
(Continued)

(58) Field of Classification Search
CPC ............ H04B 1/3888; H04B 2001/3894; F16J 15/00; F16J 15/02; F16J 15/021
(Continued)

(56) References Cited

U.S. PATENT DOCUMENTS

2004/0056977 A1*  3/2004  Kim ................... H04M 1/0216
                                                              348/376
2015/0326967 A1    11/2015 Otani

FOREIGN PATENT DOCUMENTS

JP          8-129925 A     5/1996
JP       2013-137972 A     7/2013
(Continued)

OTHER PUBLICATIONS

International Search Report and Written Opinion of the International Searching Authority issued by the Japanese Patent Office for International Application No. PCT/JP2015/084634.

*Primary Examiner* — Lee Nguyen
(74) *Attorney, Agent, or Firm* — Procopio Cory Hargreaves and Savitch LLP

(57) ABSTRACT

An electronic apparatus is disclosed. An electronic apparatus comprises a housing, a press switch, an operation button, a bonding member, and a watertight member. The housing has a front surface on which a cover panel is located and has a side surface in which a through hole is formed. The press switch is located in the housing and has a press surface facing the through hole. The operation button is a button for pressing the press switch. The bonding member has watertightness and has a portion that surrounds a circumference of one opening of the through hole. The watertight member is located between the press switch and the operation button and is bonded to the housing with the bonding member such that the watertight member blocks the one opening.

19 Claims, 12 Drawing Sheets

(51) Int. Cl.
*H01H 13/06* (2006.01)
*H04M 1/18* (2006.01)
*H05K 5/02* (2006.01)
*H05K 5/03* (2006.01)
*H04B 1/38* (2015.01)

(52) U.S. Cl.
CPC ......... *H05K 5/03* (2013.01); *H01H 2221/002* (2013.01); *H01H 2223/002* (2013.01); *H04B 2001/3894* (2013.01)

(58) Field of Classification Search
USPC ...................................................... 455/575.8
See application file for complete search history.

(56) References Cited

FOREIGN PATENT DOCUMENTS

| | | |
|---|---|---|
| JP | 2013-255008 A | 12/2013 |
| WO | 2013/094391 A1 | 6/2013 |

* cited by examiner

ELECTRONIC APPARATUS

CROSS-REFERENCE TO RELATED APPLICATION

The present application is a continuation based on PCT Application No. PCT/JP2015/84634 filed on Dec. 10, 2015, which claims the benefit of Japanese Application No. 2014-262326, filed on Dec. 25, 2014. PCT Application No. PCT/JP2015/84634 is entitled "ELECTRONIC APPARATUS", and Japanese Application No. 2014-262326 is entitled "ELECTRONIC APPARATUS". The contents of which are incorporated by reference herein in their entirety.

FIELD

Embodiments of the present disclosure relate to an electronic apparatus.

BACKGROUND

Various technologies have conventionally been proposed for electronic apparatuses.

SUMMARY

An electronic apparatus is disclosed. In one embodiment, an electronic apparatus comprises a housing, a press switch, an operation button, a bonding member, and a watertight member. The housing has a front surface on which a cover panel is located and has a side surface in which a through hole is formed. The press switch is located in the housing and has a press surface facing the through hole. The operation button is a button for pressing the press switch. The bonding member has watertightness and has a portion that surrounds a circumference of one opening of the through hole. The watertight member is located between the press switch and the operation button and is bonded to the housing with the bonding member such that the watertight member blocks the one opening.

DETAILED DESCRIPTION

<External Appearance of Electronic Apparatus>

Figure 1:
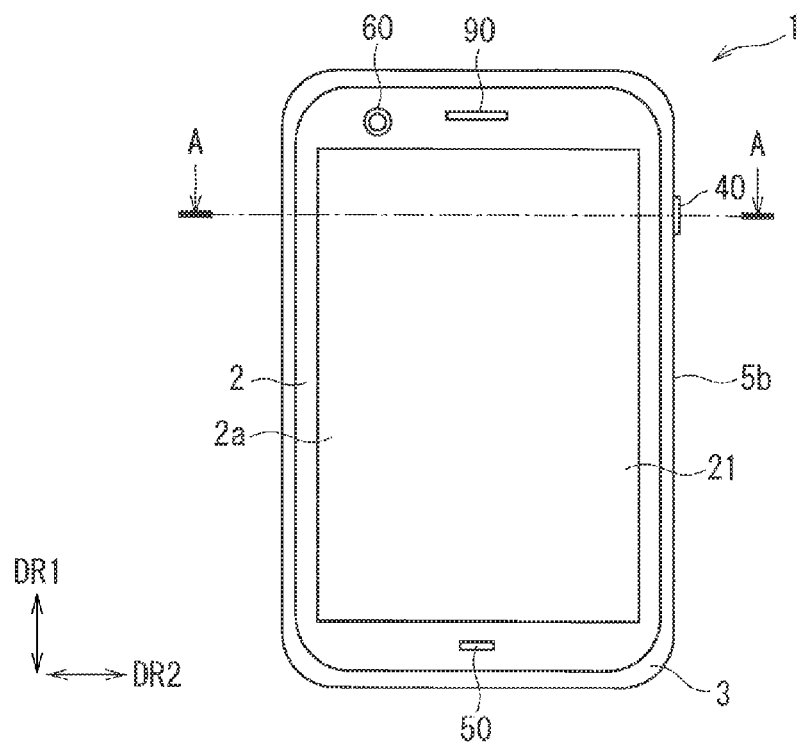
FIG. 1 illustrates a front view showing an external appearance of an electronic apparatus.
Figure 2:
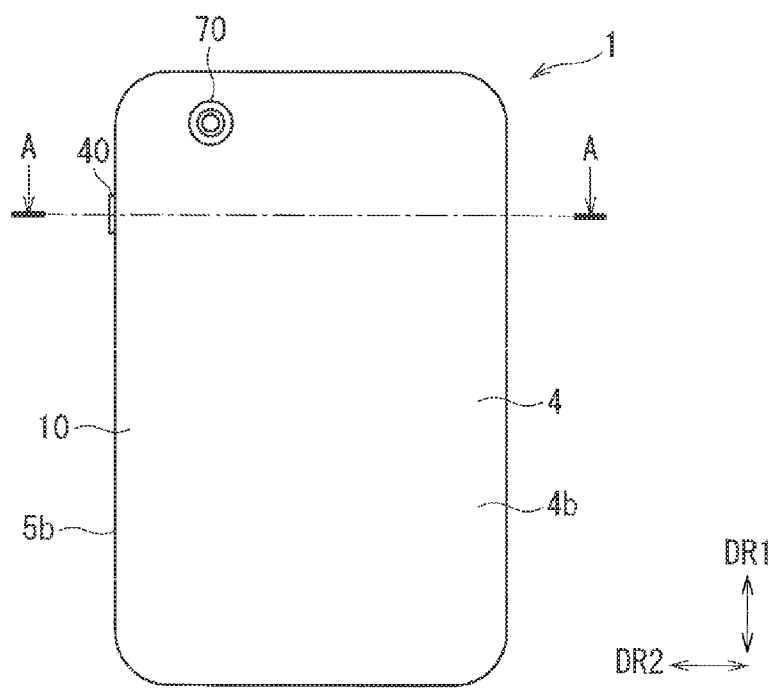
FIG. 2 illustrates a back view showing the external appearance of the electronic apparatus.
Figure 3:
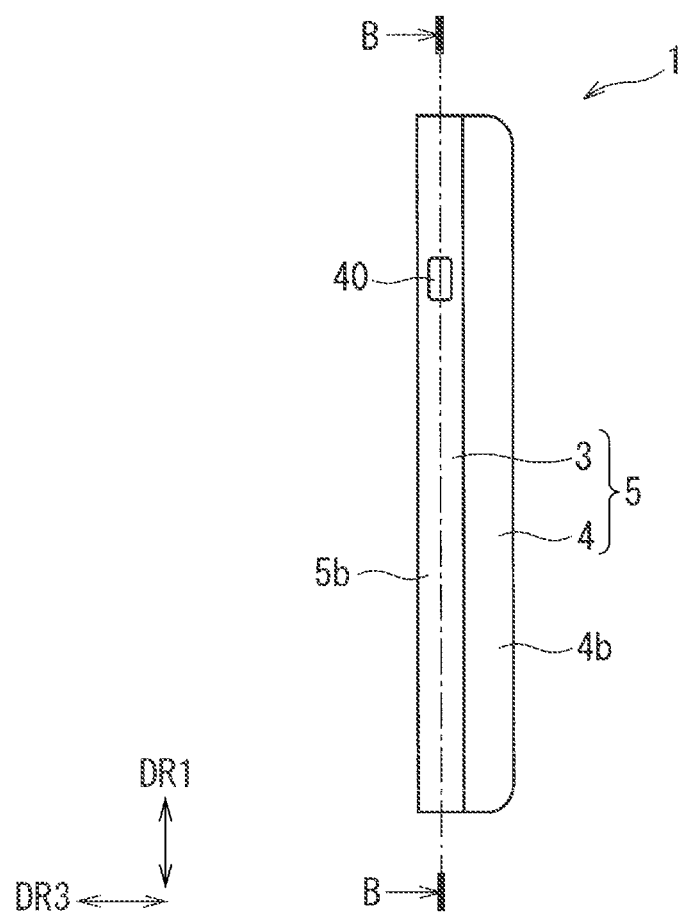
FIG. 3 illustrates a right side view showing the external appearance of the electronic apparatus.
Figure 4:
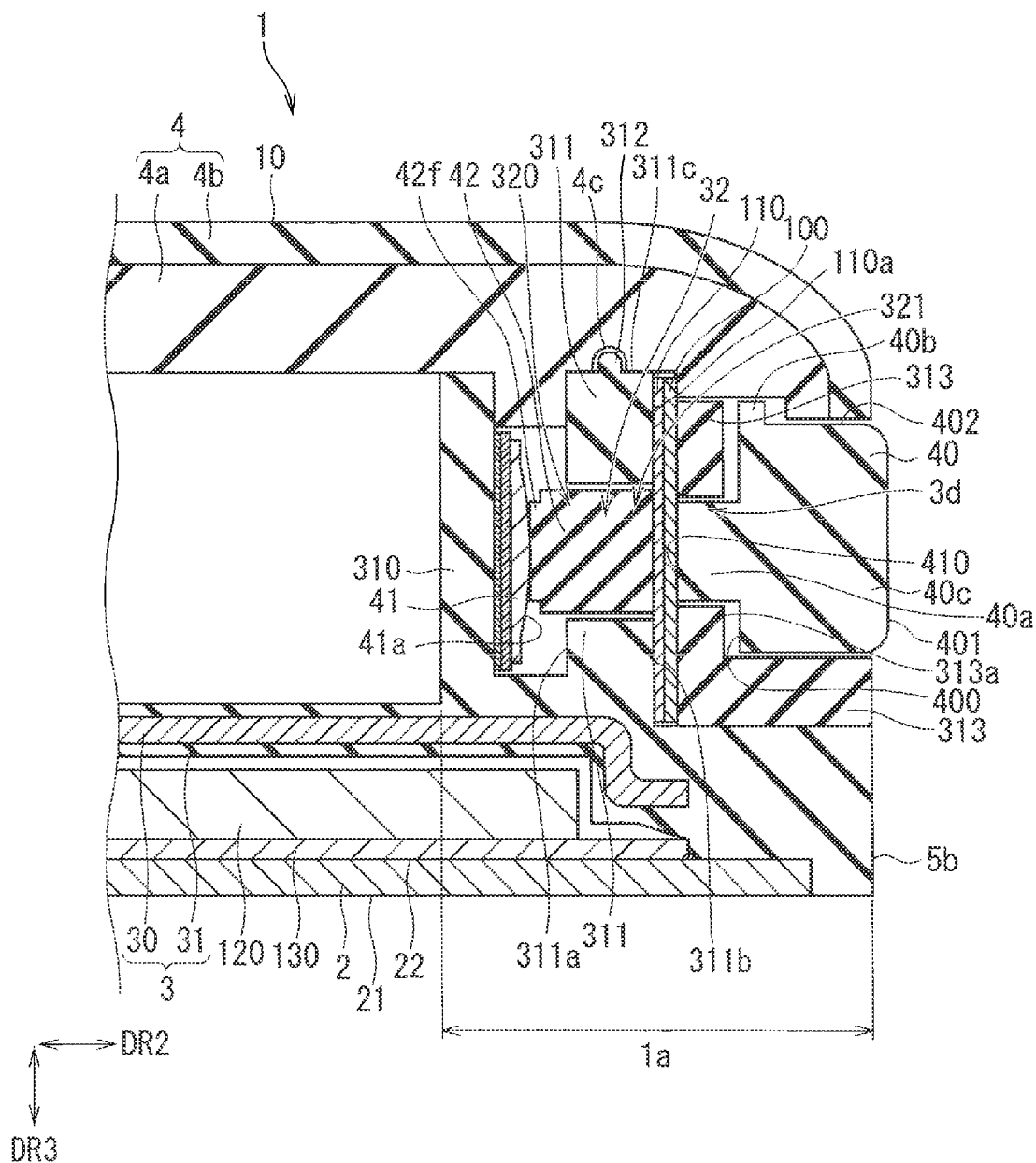
FIG. 4 illustrates an enlarged view showing a cross-sectional structure of the electronic apparatus.
Figure 5:
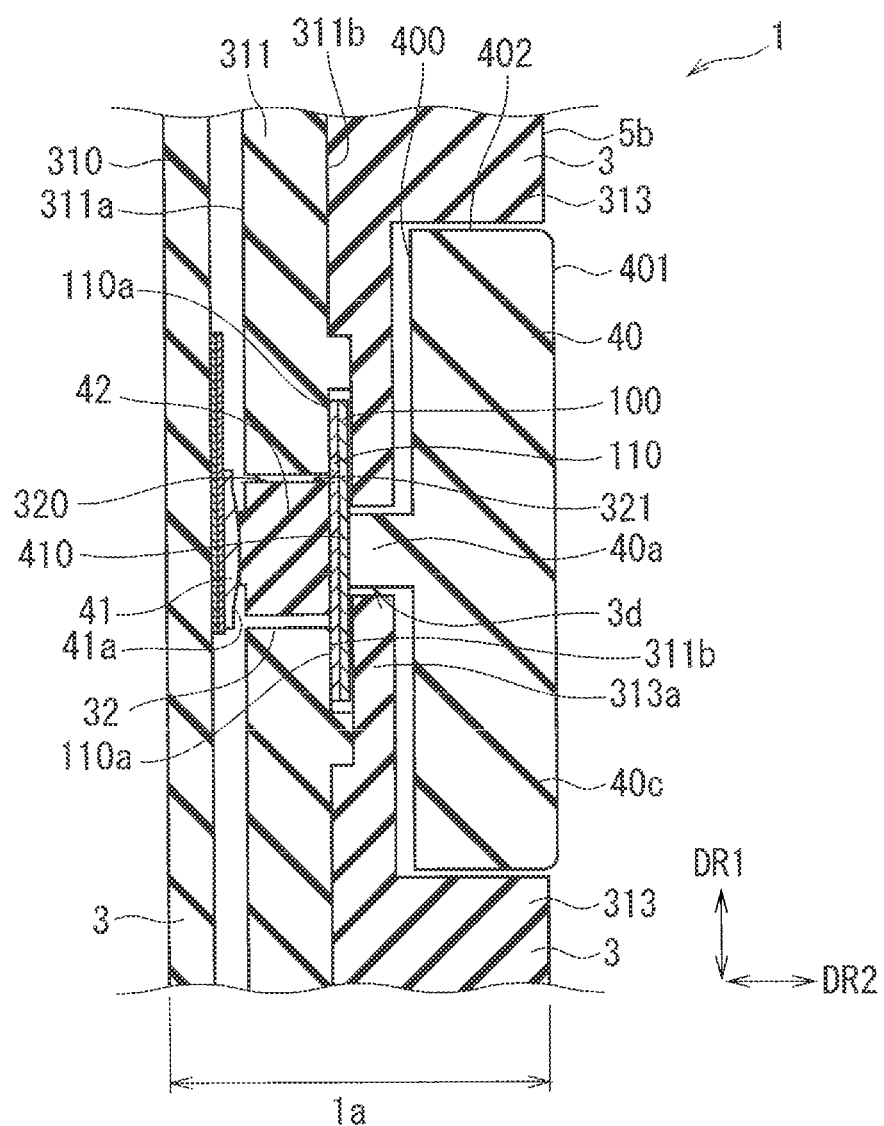
FIG. 5 illustrates an enlarged view showing a cross-sectional structure of the electronic apparatus.

FIGS. 1 to 3 respectively illustrate a front view, a back view, and a right side view showing an external appearance of an electronic apparatus 1. FIG. 4 illustrates an enlarged view showing a cross-sectional structure of the electronic apparatus 1 taken along an arrow A-A illustrated in FIGS. 1 and 2. FIG. 5 illustrates an enlarged view showing a cross-sectional structure of the electronic apparatus 1 taken along an arrow B-B illustrated in FIG. 3. The electronic apparatus 1 comprises, for example, a mobile phone such as a smartphone.

As illustrated in FIGS. 1 to 5, the electronic apparatus 1 comprises a cover panel 2 located on the front of the electronic apparatus 1, a front case 3 bonded to the cover panel 2, and a rear case 4 mounted on the front case 3. The rear case 4 comprises a case body 4a mounted on the front case 3 and a cover member 4b mounted on the case body 4a from a back surface 10 side of the electronic apparatus 1 (see FIG. 4). The front case 3 and the rear case 4 form a housing 5 of the electronic apparatus 1. The electronic apparatus 1 has a substantially rectangular plate shape in plan view.

The cover panel 2 forms a front portion of the electronic apparatus 1 except for a peripheral portion of the front portion. The front case 3 forms the peripheral portion of the front portion and a side portion of the electronic apparatus 1. The rear case 4 forms the side portion and a back portion of the electronic apparatus 1.

The front case 3 and the rear case 4 are made of resin, or resin and metal, for example. The resin is polycarbonate resin, ABS resin, or nylon resin, for example. The metal is aluminum, for example. The front case 3 comprises a sheet metal 30 for increasing rigidity of the front case 3 and a resin portion 31. The sheet metal 30 is integrally formed with the resin portion 31 by insert molding. The front case 3 and the rear case 4 are bonded to each other with an adhesive or a double-sided tape.

The cover panel 2 has a plate shape, and has a substantially rectangular shape in plan view. The cover panel 2 has an outer main surface 21 forming the front of the electronic apparatus 1 and an inner main surface 22 opposite to the outer main surface 21.

The cover panel 2 has the substantially elongated rectangular shape in a first direction DR1 parallel to the outer main surface 21. Therefore, when a direction parallel to the outer main surface 21 and perpendicular to the first direction DR1 comprises a second direction DR2, the cover panel 2 has a length in the first direction DR1 greater than a length of the cover panel 2 in the second direction DR2. A direction perpendicular to the outer main surface 21 comprises a third direction DR3. Hereinafter, the first direction DR1, the second direction DR2, and the third direction DR3 may be respectively referred to as a "longitudinal direction DR1", a "lateral direction DR2", and a "thickness direction DR3".

Further, the "left side" represents the left side of the electronic apparatus 1 when viewed from the front, and the "right side" represents the right side of the electronic apparatus 1 when viewed from the front.

The cover panel 2 is made of acrylic resin, glass, or sapphire, for example. Herein, the sapphire represents a monocrystal containing alumina ($Al_2O_3$) as a main component, and represents a monocrystal containing $Al_2O_3$ having a purity of greater than or equal to approximately 90% in the disclosure. $Al_2O_3$ may have a purity of greater than or equal to 99% in order to make scratching more difficult and to more reliably suppress cracks and chipping.

The cover panel 2 may comprise a panel having a single-layer structure including a layer made of the sapphire, or may comprise a composite panel (hereinafter may be referred to as a laminated panel) having a multilayer structure including the layer made of the sapphire.

For example, the cover panel 2 may comprise a laminated panel having a two-layer structure that includes a layer of sapphire (hereinafter may be referred to as a sapphire panel) located on the surface of the electronic apparatus 1 and a layer of glass (hereinafter may be referred to as a glass panel) bonded to the sapphire panel. The cover panel 2 may comprise a laminated panel having a three-layer structure that includes a first sapphire panel located on the surface of the electronic apparatus 1, a glass panel bonded to the first sapphire panel, and a second sapphire panel bonded to the glass panel. The cover panel 2 may have a layer made of a crystalline material except for the sapphire, such as diamond, zirconia, titania, crystal, lithium tantalite, or aluminum oxynitride. They may have a purity of greater than or equal to 90% in order to make scratching more difficult and to more reliably suppress cracks and chipping.

The peripheral portion of the cover panel 2 is bonded to the front case 3 with the double-sided tape or the adhesive such that the outer main surface 21 faces the outside.

A touch panel 130 is bonded to the inner main surface 22 of the cover panel 2. A display portion 120 is bonded to a main surface of the touch panel 130 opposite to the inner main surface 22 of the cover panel 2. The display portion 120 and the touch panel 130 are located in space surrounded by the cover panel 2 and the front case 3.

The display portion 120 comprises a liquid crystal display or an organic electroluminescent (EL) display, for example. The cover panel 2 has a transparent display region (also referred to as a display window) 2a allowing a display of the display portion 120 to pass therethrough. A user of the electronic apparatus 1 can visually identify information displayed on the display portion 120 from the outside of the electronic apparatus 1 through the display region 2a.

The touch panel 130 is a projected capacitive touch panel, for example. When a user of the electronic apparatus 1 operates the display region 2a of the cover panel 2 with an operator such as his or her finger, the operation is detected on the touch panel 130. Thus, the user can provide various instructions to the electronic apparatus 1.

As illustrated in FIG. 1, the cover panel 2 has a microphone hole 50 in a lower end portion. The cover panel 2 has a receiver hole 90 in an upper end portion. An operation button 40 is exposed from a right side surface 5b of the front case 3. The operation button 40 is made of resin, for example.

The cover panel 2 has a front lens transparent portion 60 in the upper end portion, and the front lens transparent portion 60 allows an imaging lens included in a front imaging unit in the housing 5 to be visually recognizable from the outside of the electronic apparatus 1. The electronic apparatus 1 has a back lens transparent portion 70 in the upper end portion of the back surface 10, and the back lens transparent portion 70 allows an imaging lens included in a back imaging unit in the housing 5 to be visually recognizable from the outside of the electronic apparatus 1.

A microphone, a receiver, the front imaging unit, and the back imaging unit included in the electronic apparatus 1 are located in the housing 5 (not shown).

The microphone can convert a sound input from the outside of the electronic apparatus 1 into an electrical sound signal. The sound from the outside of the electronic apparatus 1 is taken inside the electronic apparatus 1 through the microphone hole 50 located in the front of the cover panel 2, and the sound is input to the microphone.

The receiver is a dynamic speaker, for example. The receiver can convert an electrical sound signal received by the electronic apparatus 1, for example, into a sound and output the sound. The sound output from the receiver is output to the outside through the receiver hole 90 located in the front of the cover panel. The receiver can output a received sound, for example. Moreover, the receiver may additionally comprise a receiver formed of a piezoelectric vibrating element.

The front imaging unit comprises the imaging lens and an image sensor. The imaging lens of the front imaging unit can be visually recognizable through the front lens transparent portion 60 located in the front of the electronic apparatus 1. Therefore, the front imaging unit can capture images of an object in front of the electronic apparatus 1 (on the cover panel 2 side).

The back imaging unit comprises the imaging lens and an image sensor. The imaging lens of the back imaging unit can be visually recognizable through the back lens transparent portion 70 located in the back surface 10 of the electronic apparatus 1. Therefore, the back imaging unit can capture images of an object on the back surface 10 side of the electronic apparatus 1.

The operation button 40 functions, together with a press switch 41 located in the front case 3, as an operating unit that provides various instructions to the electronic apparatus 1. The user of the electronic apparatus 1 presses the operation button 40 for pressing the press switch 41. The press switch 41 is turned on when a press surface 41a is pressed, and the press switch 41 can output an electrical signal indicating that the press surface 41a has been pressed. The electronic apparatus 1 recognizes that the press switch 41 has been pressed based on the electrical signal, and the electronic apparatus 1 can perform a predetermined operation. In a case where the operation button 40 is, for example, a shutter button of the front imaging unit and the back imaging unit, the electronic apparatus 1 allows the front imaging unit or the back imaging unit to capture still images or moving images when the user presses the operation button 40.

<Measures to Make Through Hole of Housing Watertight>

To press the press switch 41 in the housing 5 by pressing the operation button 40 exposed from the surface of the housing 5, a first through hole 32 is formed between the operation button 40 and the press switch 41 of the housing 5 (see FIGS. 4 and 5). For measures to make the electronic apparatus 1 watertight, water is made difficult to enter the housing 5 through the first through hole 32 in some cases. The electronic apparatus 1 has a structure that makes water difficult to enter the housing 5 through the first through hole 32. The structure is described in detail below.

As illustrated in FIGS. 4 and 5, the resin portion 31 of the front case 3 has a first mounting portion 310 of a plate shape on which the press switch 41 is mounted. The first mounting portion 310 of the plate shape is disposed parallel to the thickness direction DR3 and the longitudinal direction DR1.

The resin portion 31 of the front case 3 has a counter portion 311 of the plate shape facing the first mounting portion 310. The counter portion 311 has a first main surface 311a facing the first mounting portion 310 and a second main surface 311b opposite to the first main surface 311a.

The counter portion 311 has the first through hole 32 penetrating in the lateral direction DR2. The first through hole 32 is formed in a right side portion 1a of the electronic apparatus 1. The press switch 41 is bonded to the first mounting portion 310 such that the press surface 41a faces an opening 320, which is formed in the first main surface 311a of the counter portion 311, of openings 320, 321 on both sides of the first through hole 32. The operation button 40 is located so as to face the opening 321, which is formed in the second main surface 311b of the counter portion 311, of the openings 320, 321 of the first through hole 32. Part of the operation button 40 is exposed from the right side surface 5b of the housing 5.

A watertight member 100 is bonded to the second main surface 311b of the counter portion 311 with a bonding member 110 such that the watertight member 100 covers the opening 321 of the first through hole 32 on the operation button 40 side. The watertight member 100 has a sheet shape and has flexibility, for example. The watertight member 100 is, for example, a member having watertightness and flexibility such as thermoplastic polyurethane (TPU). The TPU also has elasticity and resilience. The bonding member 110 has watertightness. The bonding member 110 comprises a double-sided tape having watertightness, for example.

As described above, with the simple configuration in which the watertight member 100 of the sheet shape is bonded so as to cover the opening 321 of the first through hole 32 on the operation button 40 side with the bonding member 110 having watertightness, water can be made difficult to enter the housing 5 through the first through hole 32.

The bonding member 110 is bonded to the entire region of the surface of the watertight member 100 on the opening 321 side. Therefore, the bonding member 110 covers the opening 321. However, even in a case where the bonding member 110 is located on the second main surface 311b of the counter portion 311 such that the bonding member 110 surrounds the entire circumference of the opening 321 without covering the opening 321, the watertight member 100 can be bonded to the second main surface 311b of the counter portion 311 such that the watertight member 100 covers the opening 321. In other words, the bonding member 110 may have the portion surrounding the entire circumference of the opening 321.

Measures are sometimes taken to make a gap between the front case 3 and the rear case 4 watertight. In the electronic apparatus 1, the front case 3 has a first protruding portion 312 that protrudes toward the back surface 10 of the electronic apparatus 1 in a portion facing the rear case 4. The first protruding portion 312 is located on the entire circumference of the peripheral portion of the front case 3. As illustrated in FIG. 4, the first protruding portion 312 is also located on a side surface 311c of the counter portion 311 of the plate shape on the rear case 4 side. The inner surface of the case body 4a has a fitting recessed portion 4c in which the first protruding portion 312 of the front case 3 is fit. The case body 4a of the rear case 4 is mounted on the front case 3 such that the first protruding portion 312 of the front case 3 is fit in the fitting recessed portion 4c. A watertight adhesive is applied between the first protruding portion 312 and the fitting recessed portion 4c. Thus, the measures to make the gap between the rear case 4 and the front case 3 watertight can be taken.

A middle member 42 is located in the first through hole 32. The middle member 42 is located between the bonding member 110 and the press switch 41. The middle member 42 is movable in the first through hole 32 in the lateral direction DR2. Thus, the operation button 40 can press the press switch 41 with the middle member 42 therebetween. Specifically, the operation button 40 is pressed from the outside in the lateral direction DR2, to thereby cause the middle member 42 to move toward the press switch 41 with the watertight member 100 and the bonding member 110 between the operation button 40 and the middle member 42. The middle member 42 moves toward the press switch 41, to thereby press the press surface 41a of the press switch 41. When the press switch 41 is pressed, the operation button 40 presses and extends the watertight member 100 and the bonding member 110. The middle member 42 is made of resin, for example.

As illustrated in FIGS. 4 and 5, while the operation button 40 is not pressed, the operation button 40 contacts the watertight member 100. Moreover, while the operation button 40 is not pressed, the middle member 42 contacts the bonding member 110 and the press switch 41. This reduces an amount of deformation of the watertight member 100 and the bonding member 110 when the operation button 40 presses the press switch 41. Thus, degradation of the watertight member 100 and the bonding member 110 due to the deformation can be suppressed. Furthermore, the watertight member 100 can be prevented from coming off the front case 3 caused by the deformation.

The operation button 40 has a body portion 40c, and a second protruding portion 40a and a third protruding portion 40b that protrude from the body portion 40c. The body portion 40c is formed in a long and narrow quadrangular prism in the substantially longitudinal direction DR1. The operation button 40 on the first through hole 32 side has the second protruding portion 40a that protrudes from a main surface 400 of the body portion 40c toward the first through hole 32. A main surface 401 of the body portion 40c opposite to the main surface 400 is exposed from the housing 5. A user presses the main surface 401, to thereby press the operation button 40. The second protruding portion 40a faces the first through hole 32. A tip surface 410 of the second protruding portion 40a is smaller in size than a diameter of the first through hole 32. The third protruding portion 40b protrudes from a side surface 402, which faces the rear case 4, of the body portion 40c toward the rear case 4.

The resin portion 31 of the front case 3 has a second mounting portion 313 for allowing the operation button 40 to be mounted on the front case 3. The operation button 40 is fit in the second mounting portion 313 and then mounted on the front case 3. The second mounting portion 313 of the front case 3 has a second through hole 3d that penetrates in the lateral direction DR2 in a portion 313a facing the first through hole 32. The second through hole 3d faces the first through hole 32 with the watertight member 100 and the bonding member 110 therebetween. The second protruding portion 40a of the operation button 40 is placed in the second through hole 3d, and the second protruding portion 40a can press the middle member 42 with the watertight member 100 and the bonding member 110 therebetween.

The third protruding portion 40b of the operation button 40 is sandwiched between the front case 3 and the rear case 4 in the lateral direction DR2. Thus, the operation button 40 hardly comes off the housing 5.

<Structure of Middle Member>

Figure 6:
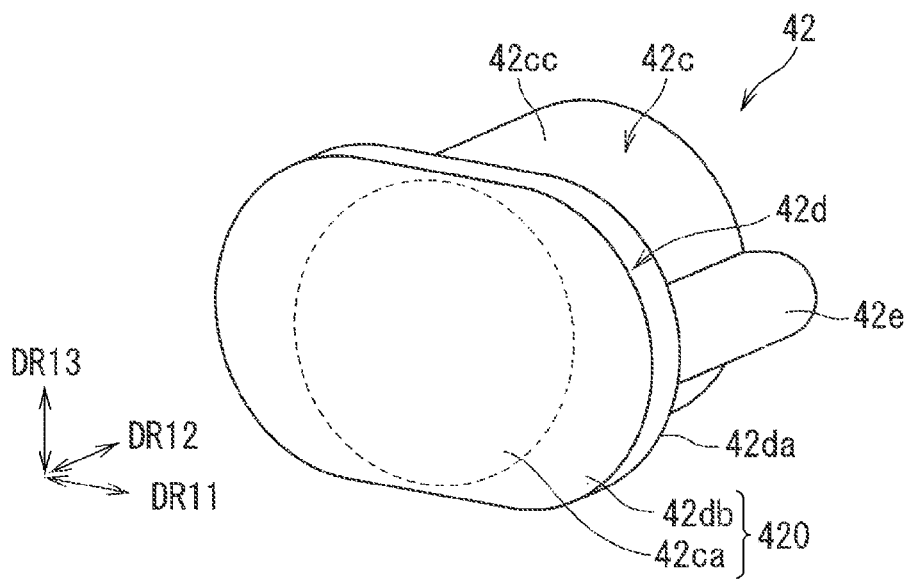
FIG. 6 illustrates a perspective view showing an external appearance of a middle member.
Figure 7:
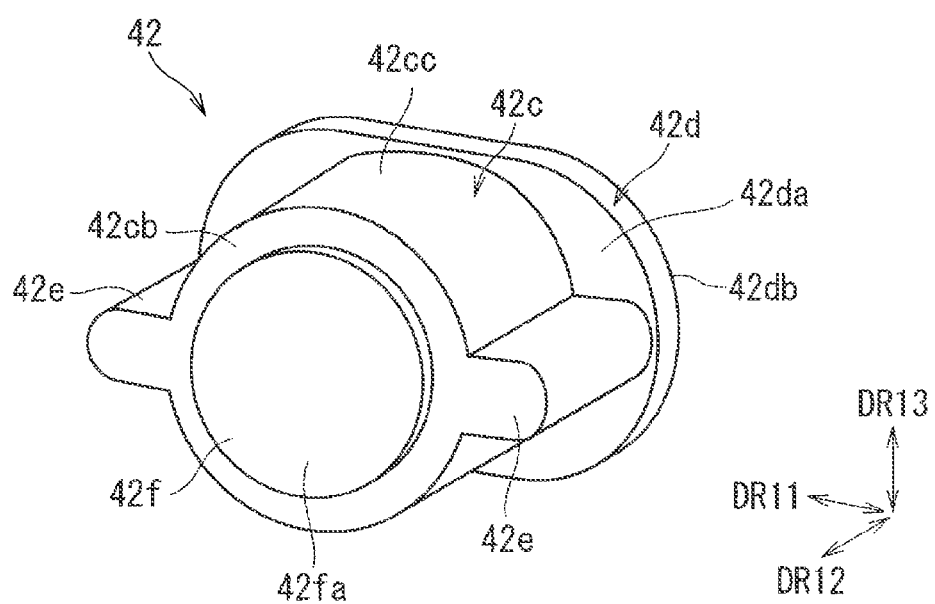
FIG. 7 illustrates a perspective view showing the external appearance of the middle member.

Hereinafter, a structure of the middle member 42 is described in detail. FIGS. 6 and 7 illustrate perspective views showing an external appearance of the middle member 42. As illustrated in FIGS. 6 and 7, the middle member 42 has a main portion 42c, a flange portion 42d, a plurality of protruding portions 42e, and a press portion 42f. The flange portion 42d and the plurality of protruding portions 42e are the structures for allowing the middle member 42 to be mounted in the first through hole 32.

The main portion 42c has a cylindrical shape, for example. The main portion 42c has a first main surface 42ca and a second main surface 42cb that face each other in a height direction and a side surface 42cc connected to the first main surface 42ca and the second main surface 42cb.

The flange portion 42d protrudes outwardly from an end portion of the side surface 42cc of the main portion 42c on the first main surface 42ca side and surrounds the first main surface 42ca. A main surface 42db of the flange portion 42d opposite to a main surface 42da on the main portion 42c side is located in the same plane as the first main surface 42ca of the main portion 42c and is connected to the first main surface 42ca. The main surface 42db of the flange portion 42d and the first main surface 42ca of the main portion 42c form a flat surface 420 having a substantially elliptical shape. The operation button 40 presses the flat surface 420 of the middle member 42. Hereinafter, the flat surface 420 is referred to as a "press surface 420".

Hereinafter, a longitudinal direction and a lateral direction of the press surface 420 of the substantially elliptical shape and a direction along the height direction of the main portion 42c of the cylindrical shape may be respectively referred to as a first direction DR11, a third direction DR13, and a second direction DR12.

As illustrated in FIGS. 6 and 7, the flange portion 42d has a protrusion distance from the side surface 42cc of the main portion 42c in the third direction DR13 shorter than a protrusion distance from the side surface 42cc of the main portion 42c in the first direction DR11.

The plurality of protruding portions 42e are located on the side surface 42cc of the main portion 42c and protrude outwardly from the side surface 42cc. Each of the protruding portions 42e extends from the main surface 42da of the flange portion 42d to the second main surface 42cb of the main portion 42c. In one example of FIGS. 6 and 7, the middle member 42 has two protruding portions 42e. The two protruding portions 42e are located on the side surface 42cc of the main portion 42c such that the two protruding portions 42e face each other in the first direction DR11.

The press portion 42f is located on the second main surface 42cb of the main portion 42c and presses the press surface 41a of the press switch 41. The press portion 42f has a circular plate shape.

The middle member 42 having the structure described above is placed in the first through hole 32 such that the press portion 42f is located on the opening 320 side and the flange portion 42d is located on the opening 321 side.

Figure 8:
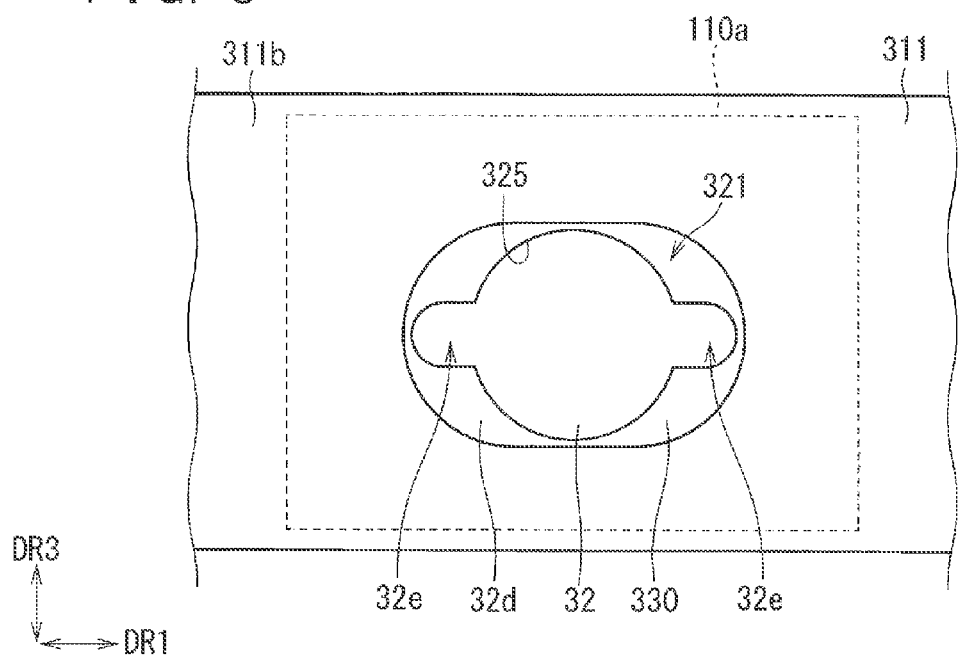
FIG. 8 illustrates a plan view of a first through hole when viewed from an operation button side.
Figure 9:
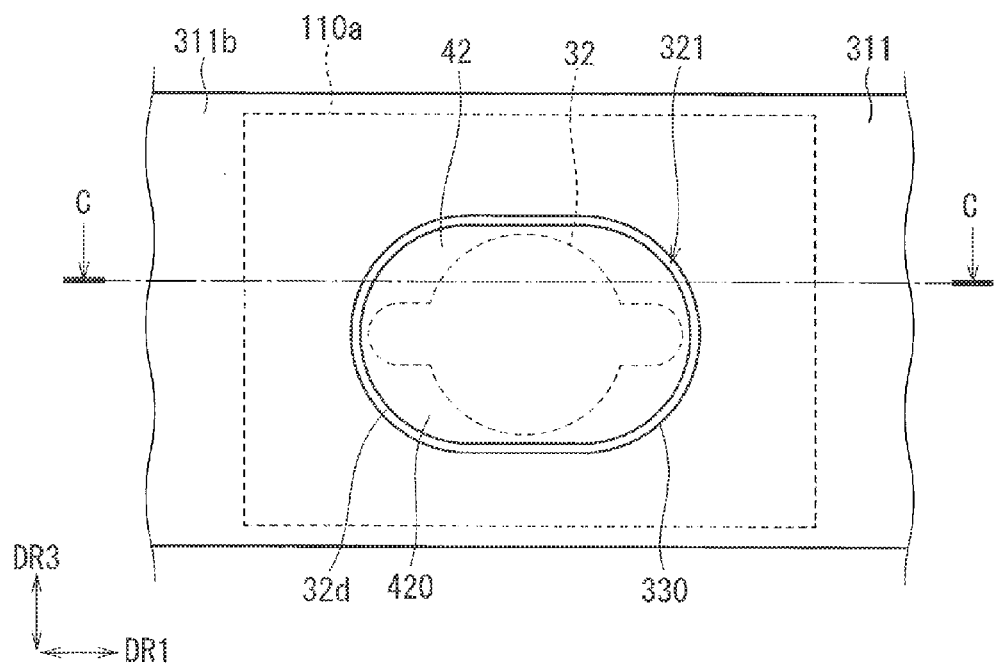
FIG. 9 illustrates a plan view of the first through hole in which the middle member is placed when viewed from the operation button side.
Figure 10:
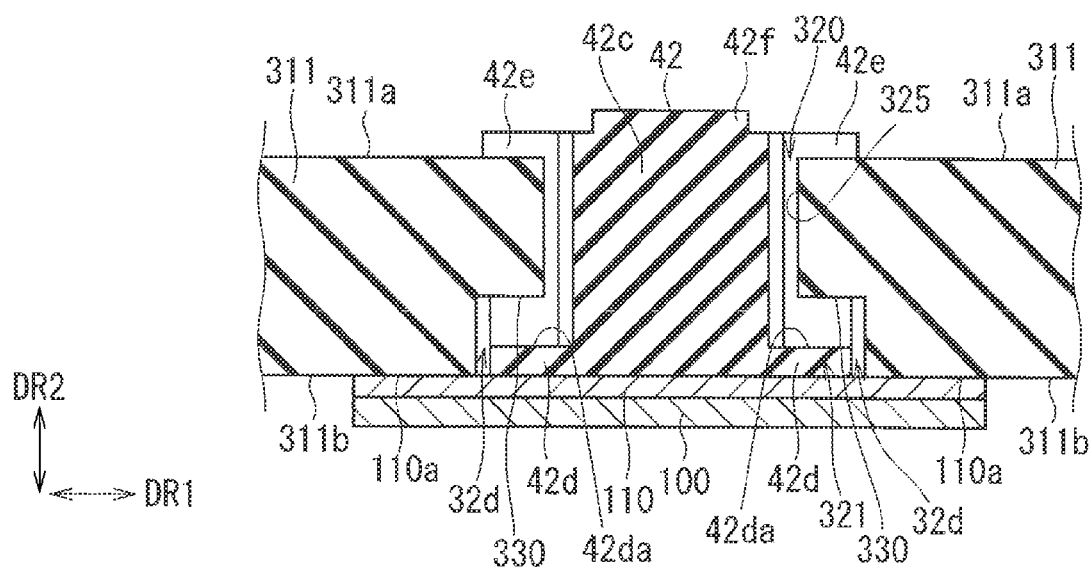
FIG. 10 illustrates an enlarged view showing a cross-sectional structure of the first through hole.

FIG. 8 illustrates a plan view of the first through hole 32 when viewed from the operation button 40 side. FIG. 9 illustrates a plan view of the first through hole 32 in which the middle member 42 is placed when viewed from the operation button 40 side. FIG. 10 illustrates an enlarged view showing a cross-sectional structure taken along an arrow C-C illustrated in FIG. 9. FIG. 10 also illustrates the watertight member 100 bonded to the counter portion 311 of the front case 3 with the bonding member 110. In FIGS. 8 and 9, a bonding region 110a to which the watertight member 100 is bonded in the second main surface 311b of the counter portion 311 of the front case 3 is indicated by a broken line.

An interior wall 325 of the first through hole 32 has two groove portions 32e in which the two protruding portions 42e of the middle member 42 are fit. The groove portions 32e each penetrate the counter portion 311 of the front case 3 in the lateral direction DR2.

As illustrated in FIG. 9, the opening 321 of the first through hole 32 on the watertight member 100 side has a substantially elliptical shape corresponding to the shape of the press surface 420 of the middle member 42. The opening 321 is slightly greater than the press surface 420.

The interior wall 325 of the first through hole 32 has a step portion 330 facing the opening 321 in a position slightly inward from the opening 321. The step portion 330 is located circumferentially on the interior wall 325. The first through hole 32 has space between the step portion 330 and the opening 321, and the space is a fitting portion 32d in which the flange portion 42d of the middle member 42 is fit. The middle member 42 is placed in the first through hole 32 such that the main surface 42da of the flange portion 42d faces the step portion 330.

While the press switch 41 is not pressed, the flange portion 42d and the step portion 330 has the space therebetween as illustrated in FIG. 10. Thus, the middle member 42 is movable toward the press switch 41 to press the press switch 41.

At the time of assembly work of the middle member 42, a worker holds the middle member 42 in his or her hand and inserts it into the first through hole 32, for example. The middle member 42 is inserted into the first though hole 32 from the opening 321 of the first through hole 32 on the second main surface 311b side such that the press portion 42f faces the press switch 41. The main portion 42c of the middle member 42 has a diameter of approximately 2 mm, for example, so that the worker may hardly hold the middle member 42. The middle member 42 has the flange portion 42d in the electronic apparatus 1, so that the worker can easily hold the flange portion 42d and insert the middle member 42 into the first through hole 32 from the press portion 42f. This can improve the workability.

The surface of the middle member 42 has the protruding portions 42e extending in a direction in which the middle member 42 is pressed. The interior wall 325 of the first through hole 32 has the groove portions 32e in which the protruding portions 42e are fit. Therefore, if the middle member 42 is inserted into the first through hole 32 in the wrong direction, the middle member 42 is hardly inserted into the first through hole 32. This can prevent the middle member 42 from being mounted in the wrong direction.

The protruding portions 42e on the surface of the middle member 42 that are fit in the groove portions 32e in the interior wall 325 of the first through hole 32 extend in the direction in which the middle member 42 is pressed. Thus, the middle member 42 when being pressed is prevented from moving in a direction other than the lateral direction DR2.

The flange portion 42d of the middle member 42 placed in the first through hole 32 has the protrusion distance in the thickness direction DR3 shorter than the protrusion distance in the longitudinal direction DR1. In other words, as illustrated in FIG. 9, the press surface 420 of the middle member 42 has a length in the thickness direction DR3 shorter than a length in the longitudinal direction DR1. Thus, the housing 5 of the electronic apparatus 1 can be reduced in thickness.

A surface 42fa, which contacts the press surface 41a, of the press portion 42f is smaller than a diameter of the main portion 42c (see FIG. 7). A sense of pressure when an user presses the operation button 40 can be adjusted by adjusting the size of the surface 42fa. The shape of the middle member 42 is not limited to the shape as described above.

<Various Modifications>
<First Modification>

Figure 11:
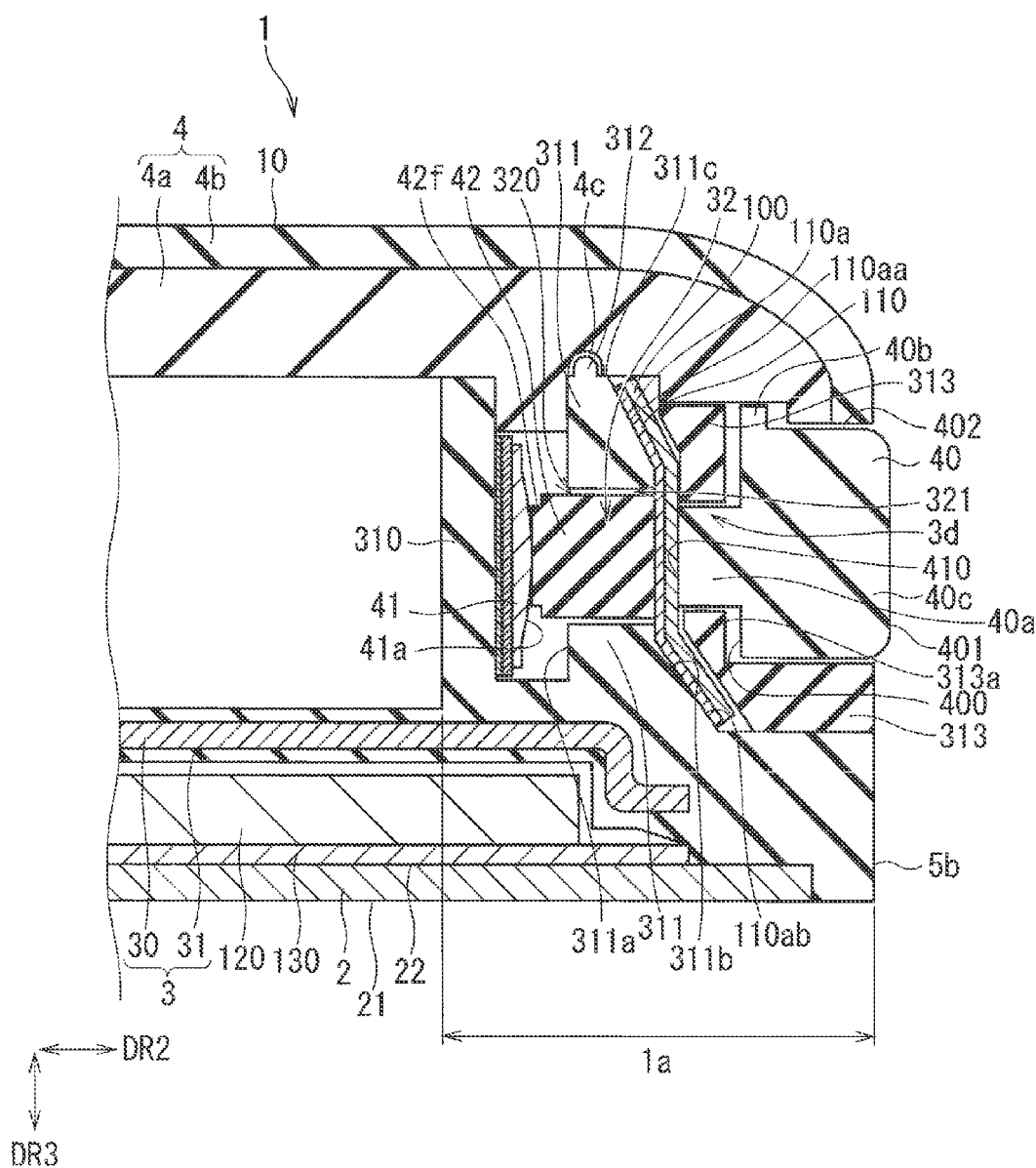
FIG. 11 illustrates an enlarged view showing a cross-sectional structure of an electronic apparatus.
Figure 12:
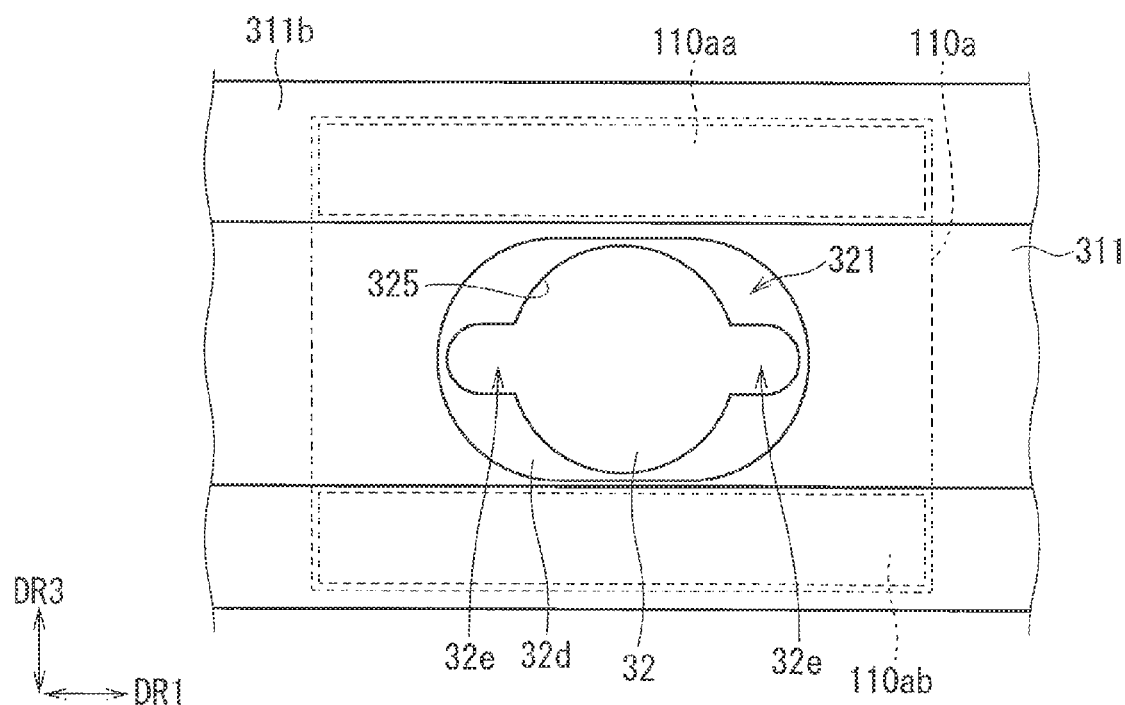
FIG. 12 illustrates a plan view of the first through hole when viewed from the operation button side.

FIG. 11 illustrates an enlarged view showing a cross-sectional structure of the electronic apparatus 1 according to a first modification. FIG. 12 illustrates a plan view of the first through hole 32 when viewed from the operation button 40 side.

As illustrated in FIGS. 11 and 12, the bonding region 110a to which the watertight member 100 is bonded in the second main surface 311b of the counter portion 311 has a first inclined surface 110aa and a second inclined surface 110ab inclined with respect to the thickness direction of the housing 5, namely, the thickness direction DR3. In plan view, the first inclined surface 110aa and the second inclined surface 110ab face each other in the thickness direction DR3 with the opening 321 of the first through hole 32 therebetween. The first inclined surface 110aa on the rear case 4 side is inclined toward the inside of the electronic apparatus 1 with respect to the thickness direction DR3. On the other hand, the second inclined surface 110ab on the cover panel 2 side is inclined toward the outside of the electronic apparatus 1 with respect to the thickness direction DR3.

In this manner, the bonding region 110a of the front case 3 has the first inclined surface 110aa and the second inclined surface 110ab inclined with respect to the thickness direction DR3, so that the bonding region 110a can be increased without increasing the thickness of the front case 3. In other words, in a case where the size of the bonding region 110a is fixed, the electronic apparatus 1 can be reduced in thickness.

The watertight member 100 has the sheet-shaped member having flexibility. Thus, in a case where the bonding region 110a has the first inclined surface 110aa and the second inclined surface 110ab, the watertight member 100 can be easily bonded to the bonding region 110a according to the shape of the bonding region 110a.

In addition, the first inclined surface 110aa and the second inclined surface 110ab are inclined in the direction opposite to each other, but they may be inclined in the same direction. In other words, both of the first inclined surface 110aa and the second inclined surface 110ab may be inclined toward the inside of the electronic apparatus 1 with respect to the thickness direction DR3 or toward the outside of the electronic apparatus 1 with respect to the thickness direction DR3.

<Second Modification>

Figure 13:
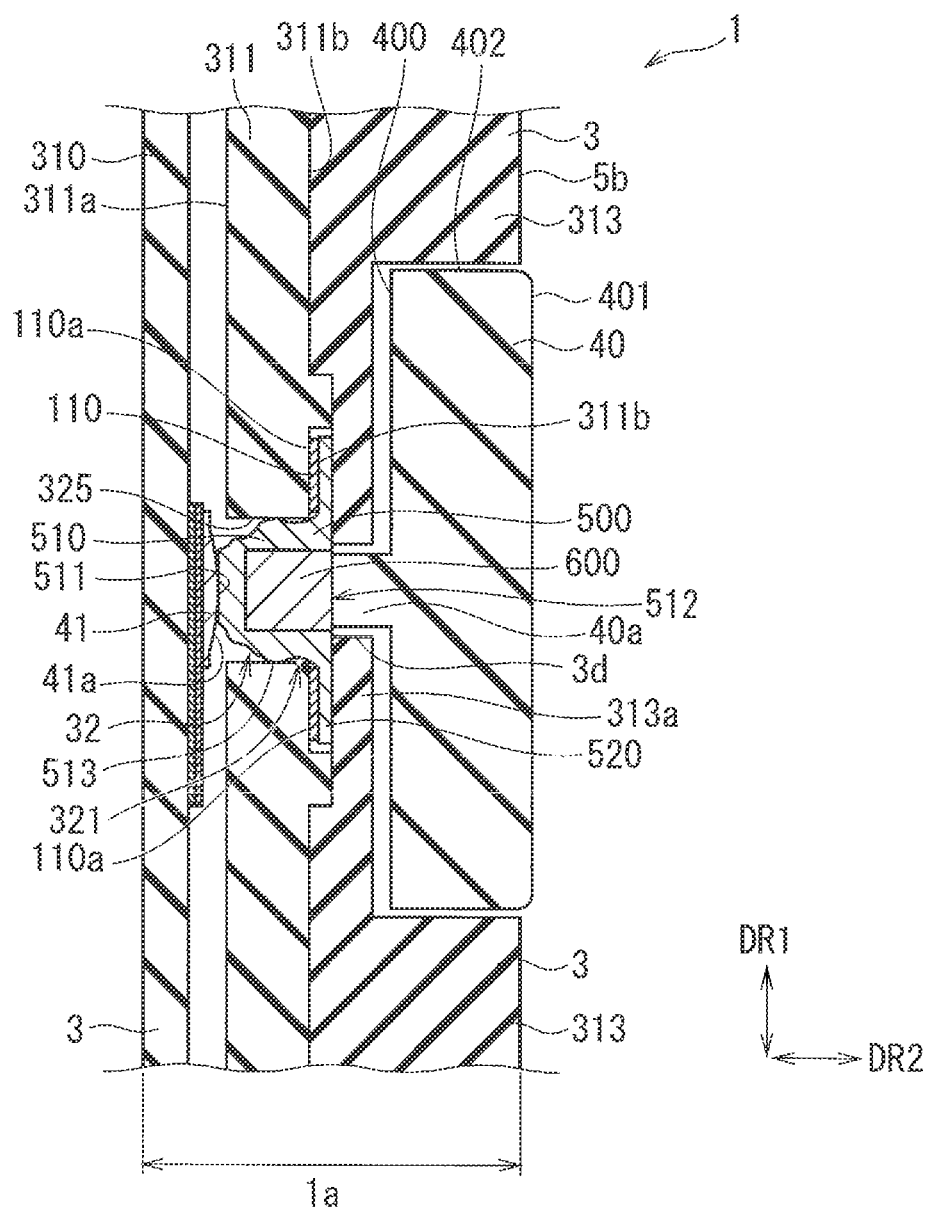
FIG. 13 illustrates an enlarged view showing a cross-sectional structure of the electronic apparatus.

FIG. 13 illustrates an enlarged view showing a cross-sectional structure of the electronic apparatus 1 according to a second modification. As illustrated in FIG. 13, the electronic apparatus 1 comprises a watertight member 500 instead of the watertight member 100 and a middle member 600 instead of the middle member 42.

The watertight member 500 is made of resin, for example. The watertight member 500 has resilience while being harder than the watertight member 100 as described above. The watertight member 500 is a molded component and has a three-dimensional shape.

The watertight member 500 has a body portion 510 having a tubular shape with one end closed and a flange portion 520 located on the other end of the body portion 510 on an opening 512 side. The flange portion 520 surrounds the entire circumference of the opening 512 of the body portion 510.

The body portion 510 is inserted into the first through hole 32 such that a bottom surface 511 of the body portion 510 faces the press switch 41 and the opening 512 faces the operation button 40. The flange portion 520 is disposed on the second main surface 311b of the counter portion 311 of the front case 3. The flange portion 520 is bonded to the second main surface 311b of the counter portion 311 with the bonding member 110 surrounding the entire circumference of the opening 321 of the first through hole 32. The flange portion 520 surrounds the entire circumference of the opening 321 of the first through hole 32. Thus, the watertight member 500 blocks the opening 321 of the first though hole 32.

A side surface 513 of the body portion 510 in the first through hole 32 contacts the interior wall 325 of the first through hole 32. The side surface 513 of the body portion 510 contacts the entire region of the interior wall 325 of the first through hole 32 in the circumferential direction of the first through hole 32. Thus, the body portion 510 blocks the first through hole 32.

The middle member 600 has a cylindrical shape, for example. The middle member 600 is made of metal, for example. The middle member 600 is disposed in the body portion 510 of the watertight member 500. The middle member 600 is bonded to the inner surface of the body portion 510 with a double-sided tape. In addition, the middle member 600 and the watertight member 500 may be integrally formed.

In the electronic apparatus 1 having such a structure, the operation button 40 directly presses the middle member 600, and the pressed middle member 600 presses the press switch 41 with the body portion 510 of the watertight member 500 therebetween. At this time, the bottom surface 511 of the body portion 510 presses the press switch 41.

Since the body portion 510 of the watertight member 500 blocks the first through hole 32, water can be prevented from entering the press switch 41 through the first through hole 32.

When the operation button 40 is pressed, the middle member 600 presses the body portion 510 that may be deformed. As a result, the side surface 513 of the body portion 510 and the interior wall 325 of the first through hole 32 may have a gap therebetween when viewed from the lateral direction DR2. In the electronic apparatus 1, the flange portion 520 of the watertight member 500 is bonded to the front case 3 with the bonding member 110 surrounding the entire circumference of the opening 321 of the first through hole 32, so that the watertight member 500 can block the opening 321. Thus, if the side surface 513 of the body portion 510 and the interior wall 325 of the first through hole 32 have the gap therebetween when viewed from the lateral direction DR2, water can be prevented from entering the press switch 41 through the first through hole 32.

<Third Modification>

Figure 14:
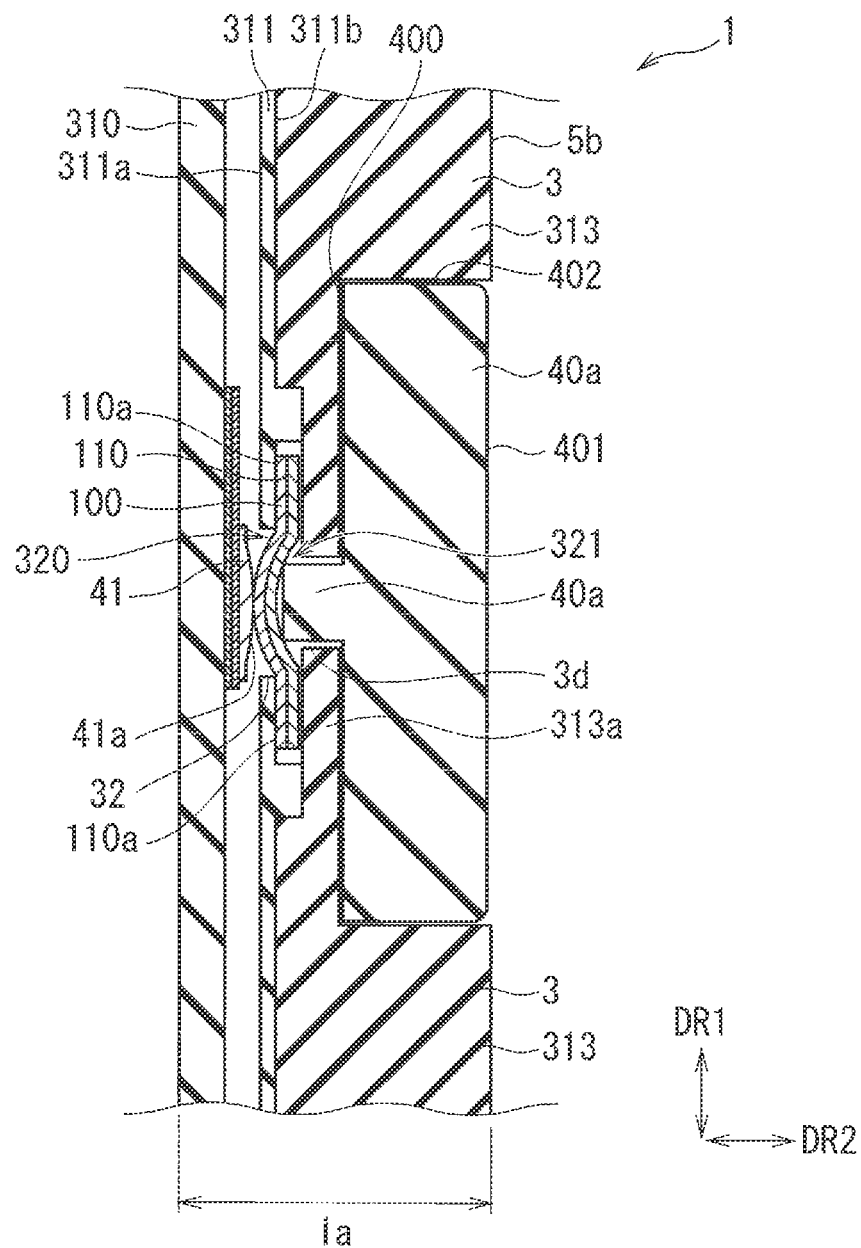
FIG. 14 illustrates an enlarged view showing a cross-sectional structure of the electronic apparatus.

FIG. 14 illustrates an enlarged view showing a cross-sectional structure of the electronic apparatus 1 according to a third modification. FIG. 14 illustrates the press switch 41 being pressed. As illustrated in FIG. 14, the electronic apparatus 1 does not comprise the middle member 42. In the electronic apparatus 1, the operation button 40 presses the press switch 41 with the watertight member 100 and the bonding member 110 therebetween. At this time, the operation button 40 presses and extends the watertight member 100 and the bonding member 110.

In this manner, the electronic apparatus 1 does not comprise the middle member 42, so that the press switch 41 can be pressed by the simple structure.

<Another Modification>

Figure 15:
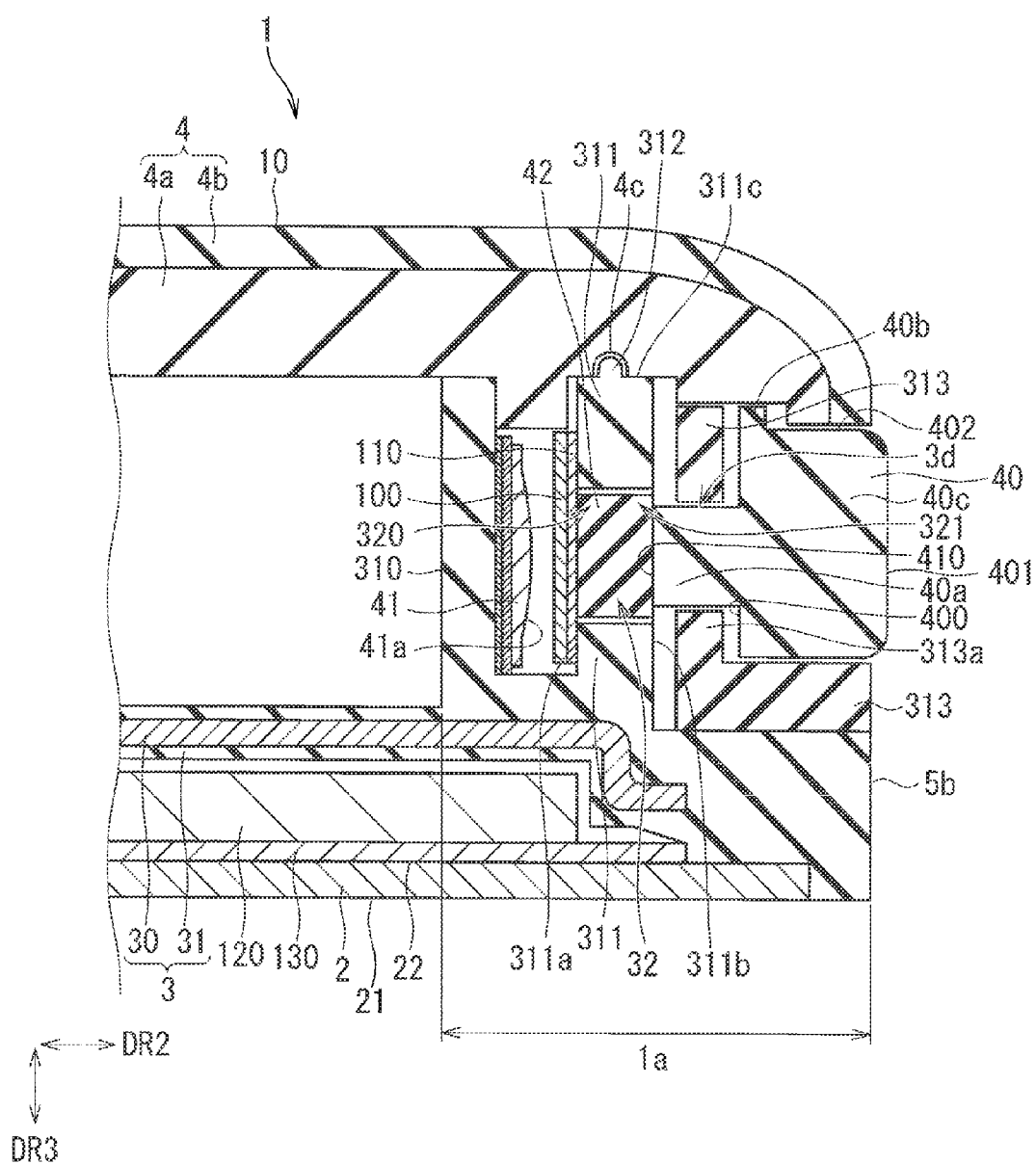
FIG. 15 illustrates an enlarged view showing the cross-sectional structure of the electronic apparatus.

In each example mentioned above, the watertight member 100 is bonded to the front case 3 so as to cover the opening 321 of the first through hole 32 on the operation button 40 side, but the watertight member 100 may be bonded to the front case 3 so as to cover the opening 320 opposite to the opening 321, as illustrated in FIG. 15. As illustrated in FIG. 15, the bonding member 110 bonds the watertight member 100 to the first main surface 311a of the counter portion 311 such that the watertight member 100 covers the opening 320 of the first through hole 32 on the press switch 41 side. In this case, the operation button 40 directly presses the middle member 42, and the pressed middle member 42 presses and extends the bonding member 110 and the watertight member 100, to thereby press the press switch 41. Also in this case, water can be prevented from entering through the first through hole 32.

In each example mentioned above, one example in which the disclosure is applied to a mobile phone is described. The disclosure is also applicable to another electronic apparatus having a press switch in a housing. For example, the disclosure is also applicable to cameras, tablet terminals, and wearable electronic apparatuses put on an arm.

In the above description, the electronic apparatus 1 is described in detail, but the above description is the exemplification in all aspects and embodiments of the present disclosure are not intended to be limited thereto. In addition, various examples described above are applicable in combination as long as they are not mutually inconsistent. And, it is construed that numerous modifications which are not exemplified can be envisaged without departing from the scope of the present disclosure.

The invention claimed is:

1. An electronic apparatus, comprising:
   a housing having a front surface on which a cover panel is located and having a side surface in which a through hole is formed;
   a press switch that is located in the housing and has a press surface facing the through hole;
   an operation button for pressing the press switch;
   a bonding member having watertightness and having a portion that surrounds a circumference of one opening of the through hole; and
   a watertight member located between the press switch and the operation button and bonded to the housing with the bonding member such that the watertight member blocks the one opening, wherein
   the operation button is located on a side surface of the housing, and
   a region of the housing to which the watertight member is bonded has an inclined surface inclined with respect to a thickness direction of the housing.

2. The electronic apparatus according to claim 1, wherein the watertight member has a sheet shape and has flexibility.

3. The electronic apparatus according to claim 2, wherein the watertight member covers the one opening to block the one opening.

4. The electronic apparatus according to claim 3, further comprising a middle member located between the press switch and the operation button and located in the through hole,
   wherein the operation button presses the middle member, so that the middle member presses the press surface.

5. The electronic apparatus according to claim 4, wherein the watertight member is located between the middle member and the operation button.

6. The electronic apparatus according to claim 4, wherein the middle member has a flange portion at one end on the operation button side.

7. The electronic apparatus according to claim 6, wherein
   the operation button is located on a side surface of the housing, and
   the flange portion has a protrusion distance in a thickness direction of the housing shorter than a protrusion distance in a direction perpendicular to the thickness direction and to a direction in which the middle member is pressed.

8. The electronic apparatus according to claim 4, wherein
   a surface of the middle member has a protruding portion that extends in a direction in which the middle member is pressed, and
   an interior wall of the through hole has a groove portion in which the protruding portion is fit.

9. The electronic apparatus according to claim 1, the operation button presses the press surface with the watertight member therebetween.

10. An electronic apparatus, comprising:
    a housing having a front surface on which a cover panel is located and having a side surface in which a through hole is formed;
    a press switch that is located in the housing and has a press surface facing the through hole;
    an operation button for pressing the press switch;
    a bonding member having watertightness and covering one opening of the through hole; and
    a watertight member located between the press switch and the operation button and bonded to the housing with the bonding member such that the watertight member blocks the one opening,
    wherein the bonding member and the watertight member are different members.

11. The electronic apparatus according to claim 10, wherein the watertight member has a sheet shape and has flexibility.

12. The electronic apparatus according to claim 11, wherein the watertight member covers the one opening to block the one opening.

13. The electronic apparatus according to claim 12, further comprising a middle member located between the press switch and the operation button and located in the through hole,
    wherein the operation button presses the middle member, so that the middle member presses the press surface.

14. The electronic apparatus according to claim 13, wherein the watertight member is located between the middle member and the operation button.

15. The electronic apparatus according to claim 13, wherein the middle member has a flange portion at one end on the operation button side.

16. The electronic apparatus according to claim 15, wherein
    the operation button is located on a side surface of the housing, and
    the flange portion has a protrusion distance in a thickness direction of the housing shorter than a protrusion distance in a direction perpendicular to the thickness direction and to a direction in which the middle member is pressed.

17. The electronic apparatus according to claim 13, wherein
   a surface of the middle member has a protruding portion that extends in a direction in which the middle member is pressed, and
   an interior wall of the through hole has a groove portion in which the protruding portion is fit.

18. The electronic apparatus according to claim 10, the operation button presses the press surface with the watertight member therebetween.

19. The electronic apparatus according to claim 10, wherein
   the operation button is located on a side surface of the housing, and
   a region of the housing to which the watertight member is bonded has an inclined surface inclined with respect to a thickness direction of the housing.

* * * * *